United States Patent
Gasanov et al.

(10) Patent No.: US 6,868,536 B2
(45) Date of Patent: Mar. 15, 2005

(54) METHOD TO FIND BOOLEAN FUNCTION SYMMETRIES

(75) Inventors: Elyar E. Gasanov, Moscow (RU); Andrej A. Zolotykh, Moskovskaya Oblast (RU); Aiguo Lu, Pleasanton, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/299,564

(22) Filed: Nov. 19, 2002

(65) Prior Publication Data

US 2004/0098676 A1 May 20, 2004

(51) Int. Cl.[7] .............................................. G06F 17/50
(52) U.S. Cl. .................. 716/18; 716/1; 716/3; 716/6
(58) Field of Search ............................... 716/1, 3, 18, 6

(56) References Cited

U.S. PATENT DOCUMENTS

| | | | | | |
|---|---|---|---|---|---|
| 4,336,468 | A | * | 6/1982 | Spillman | 326/39 |
| 6,392,653 | B1 | * | 5/2002 | Malandain et al. | 345/501 |
| 6,532,582 | B1 | * | 3/2003 | Zolotykh et al. | 716/11 |
| 6,543,032 | B1 | * | 4/2003 | Zolotykh et al. | 716/2 |
| 6,564,361 | B1 | * | 5/2003 | Zolotykh et al. | 716/8 |
| 6,637,011 | B1 | * | 10/2003 | Zolotykh et al. | 716/3 |
| 6,681,373 | B1 | * | 1/2004 | Zolotykh et al. | 716/2 |

* cited by examiner

*Primary Examiner*—Vuthe Siek
(74) *Attorney, Agent, or Firm*—Suiter West PC LLO

(57) ABSTRACT

The present invention is directed to a system and method of finding Boolean symmetries. In aspects of the present invention, a method, system and computer-readable medium constructs a symmetry tree for any Boolean function. A data structure which describes groups of commutative variables of a Boolean function is called a symmetry tree of the Boolean function.

15 Claims, 6 Drawing Sheets

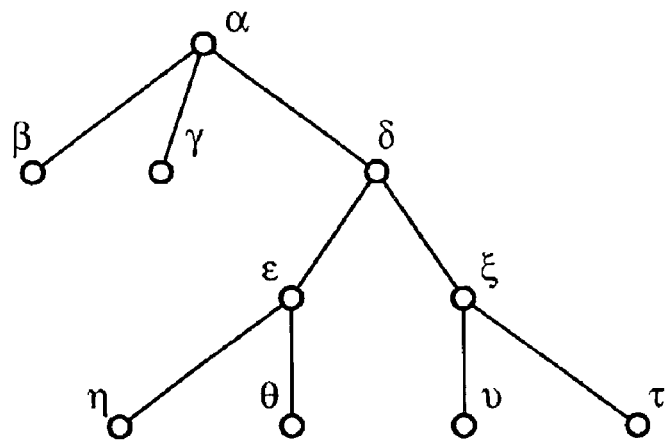
FIG._1
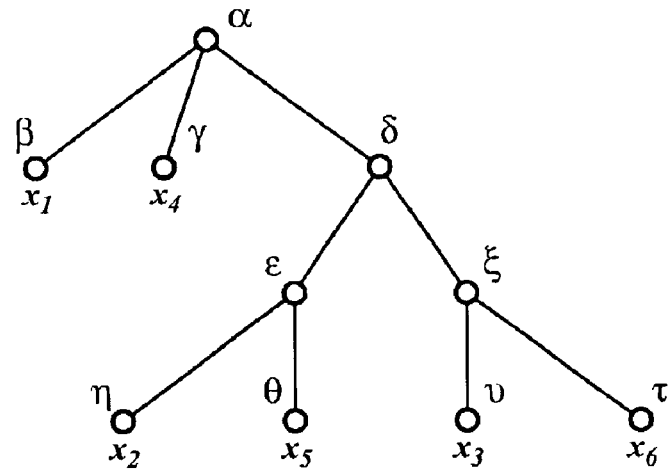
FIG._2
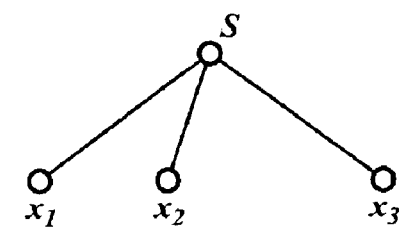
FIG._3
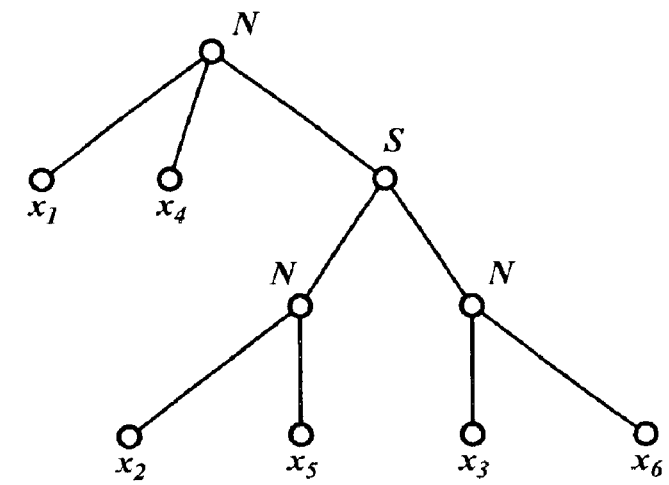
FIG._4

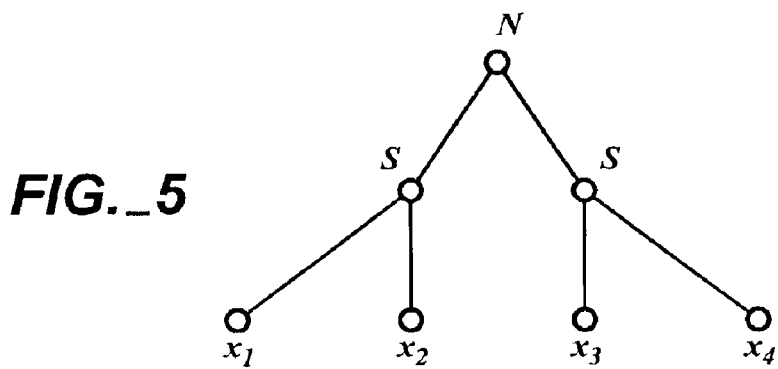
FIG._5
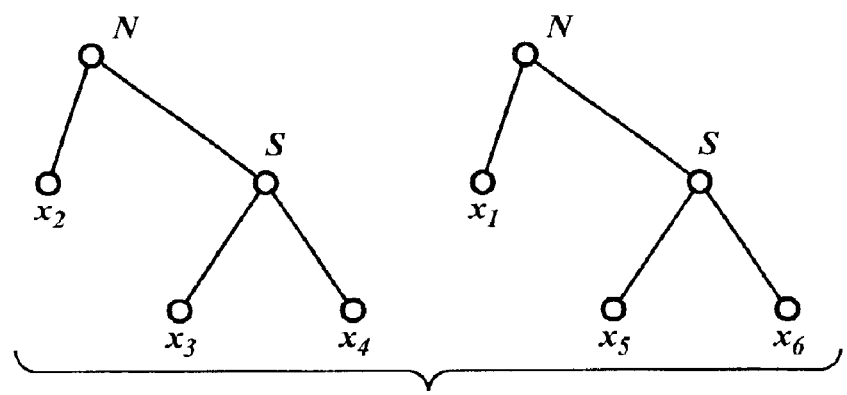
FIG._6
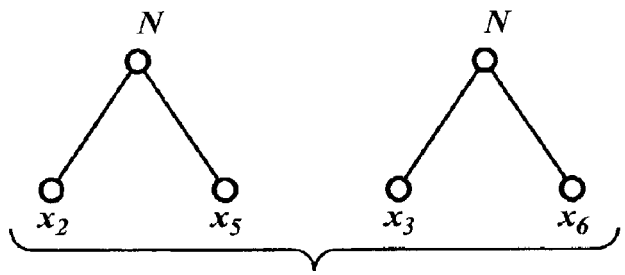
FIG._7
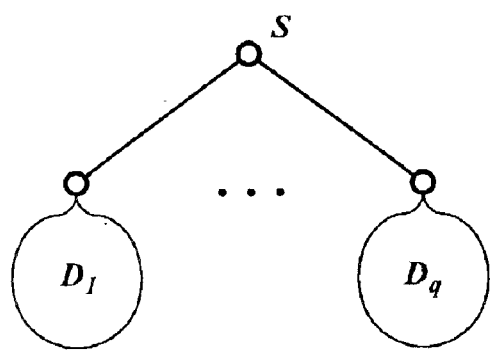
FIG._8
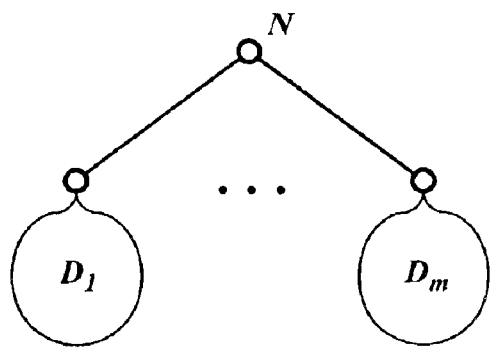
FIG._9

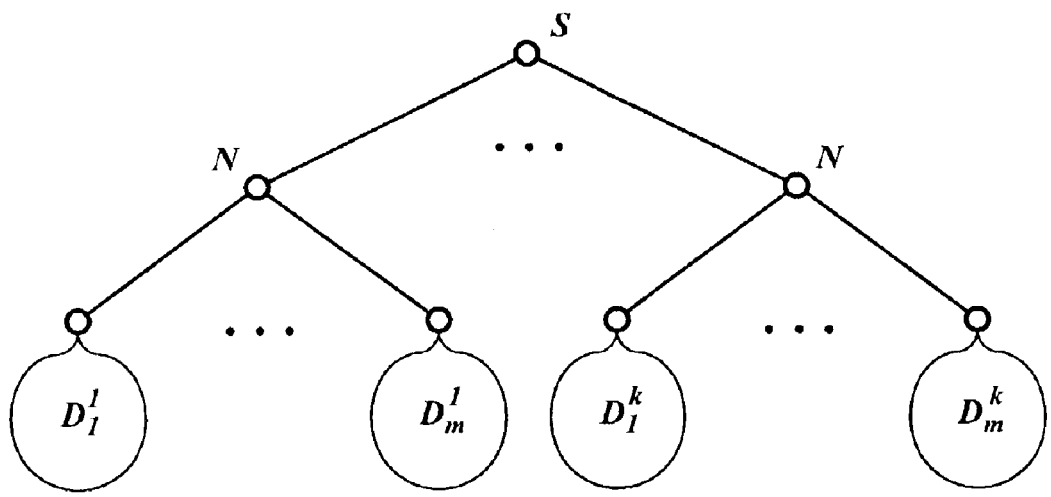
FIG._10
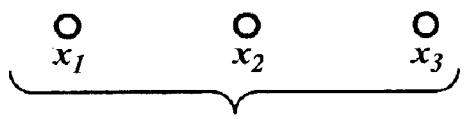
FIG._11
FIG._12
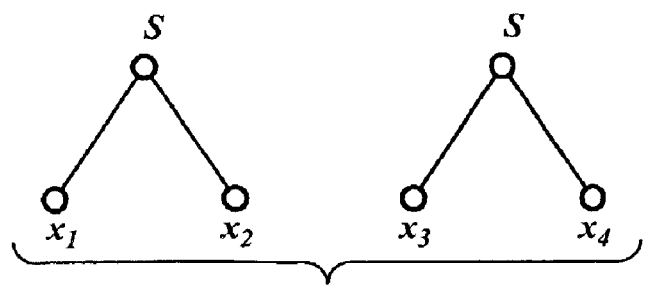
FIG._13

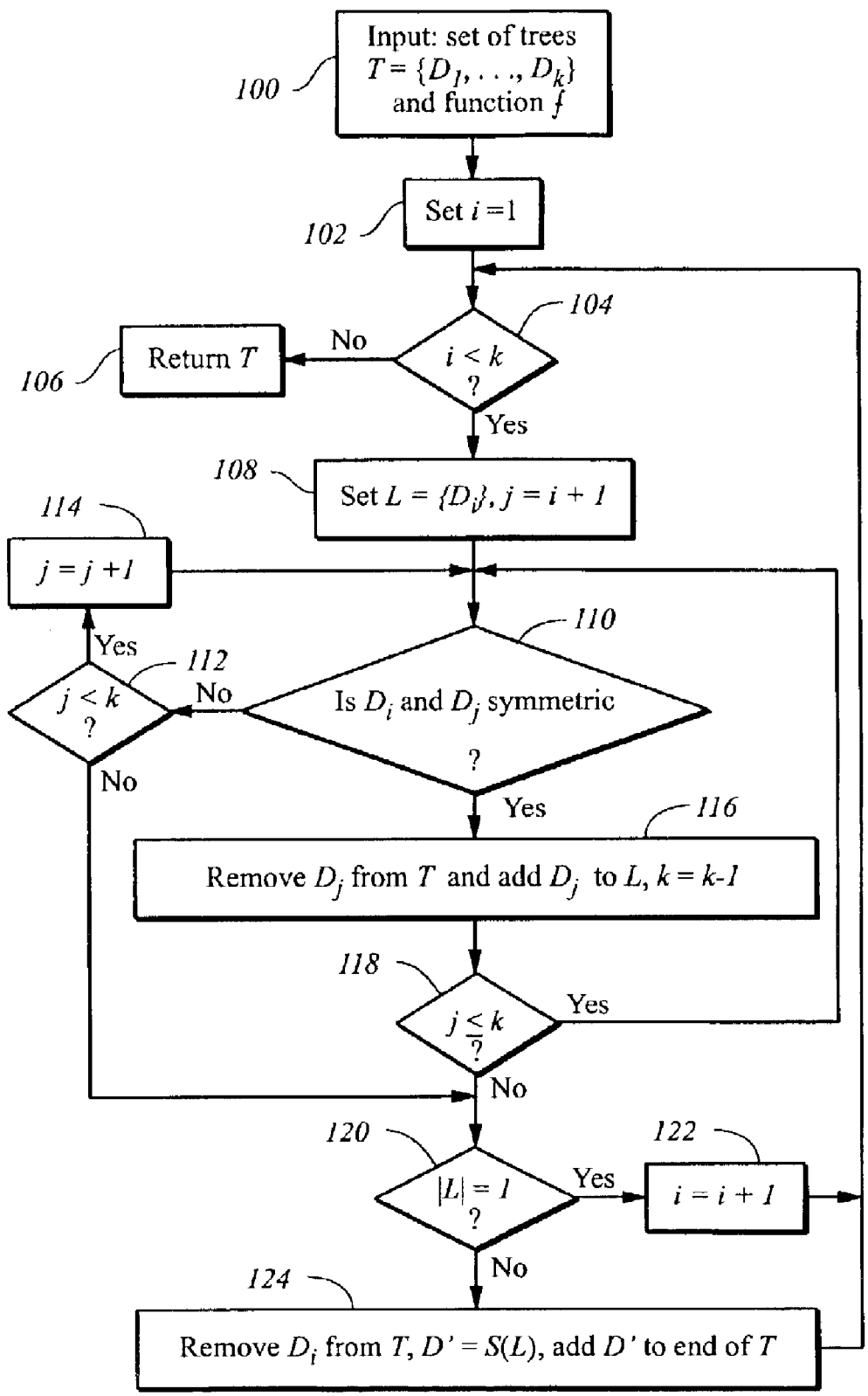
FIG._14

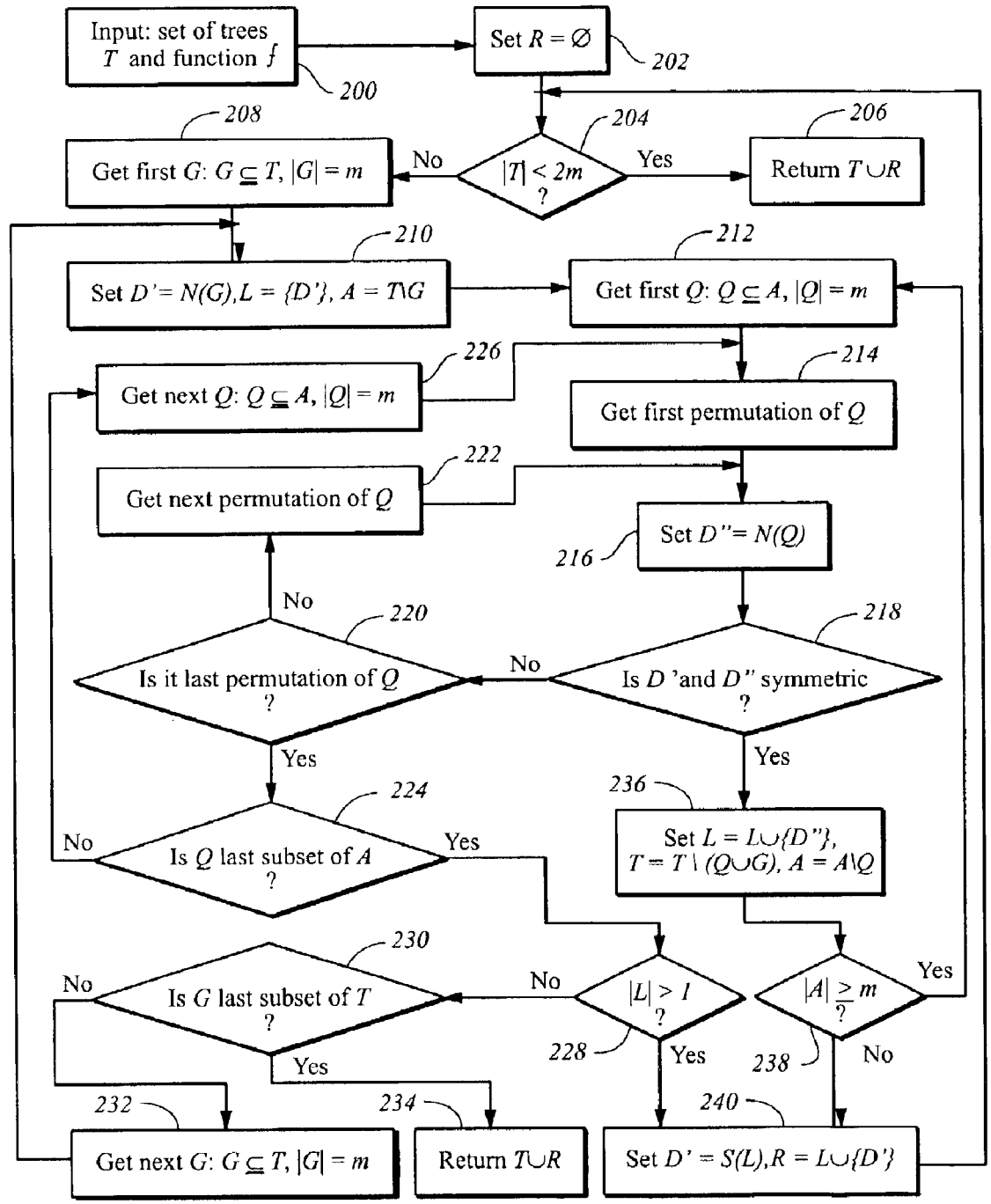
FIG._15

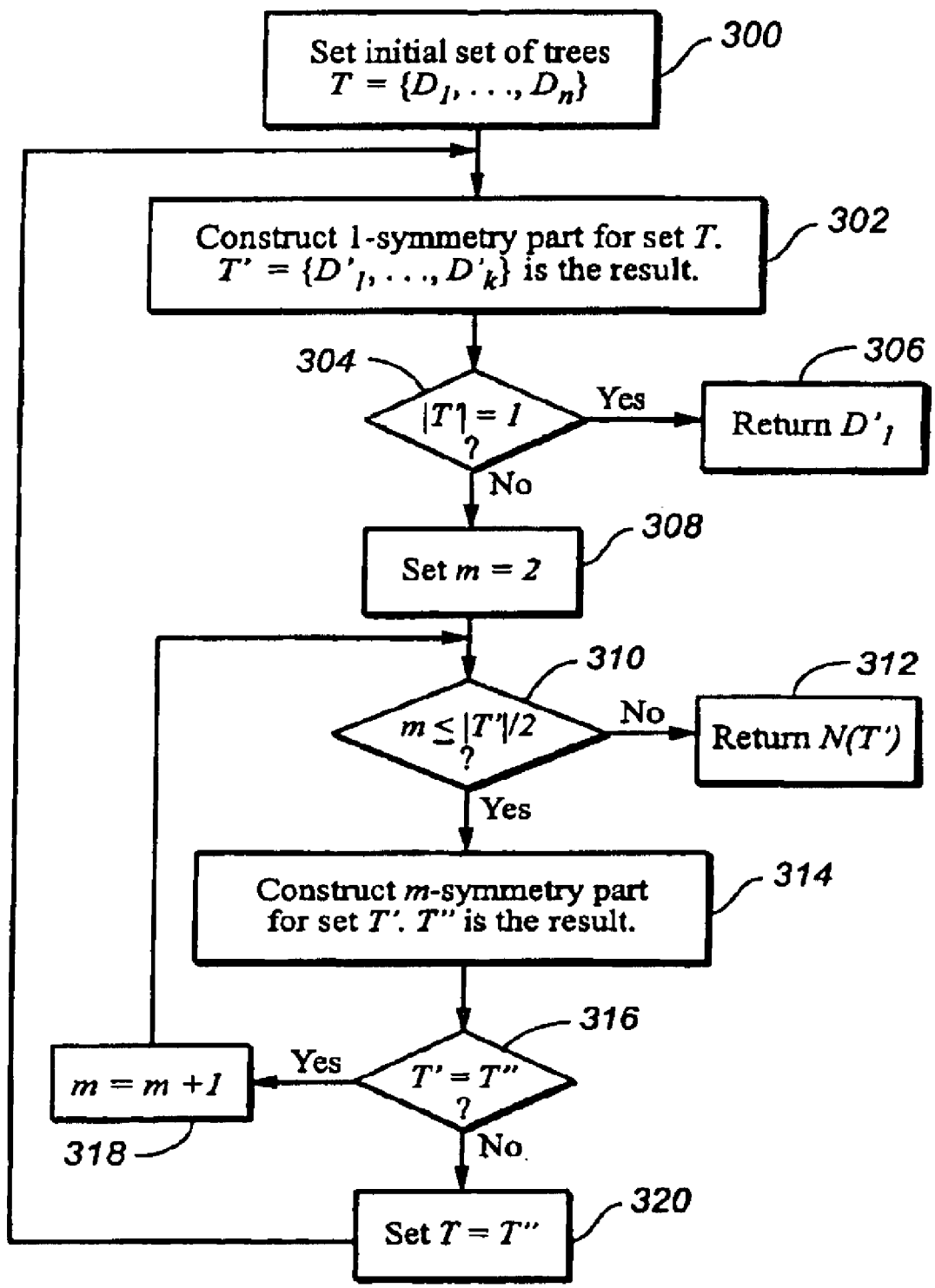
FIG._16

METHOD TO FIND BOOLEAN FUNCTION SYMMETRIES

FIELD OF THE INVENTION

The present invention generally relates to the field of integrated circuit design, and particularly to analyzing, optimizing and resynthesizing integrated circuit (IC) designs.

BACKGROUND OF THE INVENTION

An integrated circuit (IC), such as a general purpose integrated circuit, system on a chip (SOC), application specific integrated circuit (ASIC), and the like, may include cells and connections between cells formed as a semiconductor. Because of the vast range of functionality desired by manufacturers and users of integrated circuits, an extensive number of cells may be needed having complex connections between the cells.

A cell may be thought of as a functional element of a circuit provided to perform a desired function. Each cell may include one or more circuit elements such as transistors, capacitors, and other circuit elements grouped to perform the desired function. Each of the cells of an integrated circuit may have one or more pins, each of which may be connected to one or more other pins of the integrated circuit by wires. The wires connecting the pins of the integrated circuit are also formed on the surface of the chip.

A net is a set of two or more pins which are connected. Because of the vast number of pins that may be included in an integrated circuit and the variety of connections needed to communicatively couple the pins, a chip also includes definitions describing the pins and interconnects. Typically, all the pins of a net are connected. Generally, the number of nets of a chip is in the same order as the number of cells on that chip. A majority of nets include an interconnection between two pins, although nets may include much greater numbers of pins. A netlist is a list of nets for a chip.

Integrated circuits formed as chips are generally configured as a large number of electronic components fabricated by layering several different materials on a silicon base, such as a wafer. The design of an integrated circuit may be described geometrically as a layout. For instance, a layout may include a set of planar geometric shapes in several layers.

A layout is typically checked to ensure that all of the design requirements are met. The result is a set of design files in a particular unambiguous representation known as an intermediate form that describes the layout. The design files may then be converted into pattern generator files that are used to produce patterns called masks by a pattern generator, which may include optical, electron beam, and the like generation methods.

Due to the large number of components included in an integrated circuit, the decreasing size of geometric features utilized to provide functionality, and the details required by the fabrication process, the physical design process is typically performed utilizing information handling systems, such as computers and servers. Through use of these systems, the physical design process may proceed to determine an arrangement of devices, such as in a plane and/or in three dimensional space, as well as efficient interconnection and routing schemes between devices to obtain the desired functionality.

In the layout design process, typically, the input to the physical design is a circuit diagram, and the output is the layout of the circuit. This may be accomplished in several stages, including partitioning, floor planning, placement, routing and compaction.

For instance, a chip may include several million transistors. Thus, layout of the entire circuit, in certain instances, may not be handled due to limitations of memory space and computational power. Therefore, the layout may be partitioned by grouping the components into blocks, such as sub-circuits and modules. The actual partitioning process may consider a variety of factors, such as size of blocks, number of blocks, number of interconnections, and the like. The output of partitioning is a set of blocks with interconnections between the blocks, which may be described as a netlist.

Floor planning and placement may include the selection of layout alternatives for each block of a chip, as well as between blocks and to edges. During placement, the blocks are positioned on the chip, preferably in such a manner as to find a minimum area arrangement for the blocks that allows completion of interconnections between the blocks.

The routing phase completes the interconnections between blocks according to the specified netlist. For instance, space not occupied by block, which may be referred to as routing space, may be partitioned into regions called channels. Preferably, the router completes all circuit connections using the shortest possible wire length and uses only the channels.

To calculate the performance of integrated circuits, designers compute the delays of the cells in the integrated circuit. A variety of delays may be considered without departing from the spirit and scope of the present invention. For instance, a propagation delay of a cell may be defined as the time duration a signal takes to travel from an input to an output of a cell. The measurement point at the input is called the switching threshold. A propagation delay of a cell may be defined for every input to output pin combination of a cell under both rising and falling input conditions. The propagation delay is also affected by a given process (P), voltage (V) and temperature (T). Another type of delay is the setup-hold time delay which is an input constraint for sequential cells. The setup time is defined as the time duration a data signal is required to be available at the input of a cell before the clock signal transition, and the hold time is defined as the time duration a data signal is required to be stable after the clock signal transition.

Therefore, it would be desirable to provide a system and method to increase the efficiency of design and implementation of an integrated circuit.

SUMMARY OF THE INVENTION

Accordingly, the present invention is directed to a system and method of finding Boolean symmetries. In aspects of the present invention, a method, system and computer-readable medium constructs a symmetry tree for any Boolean function. A data structure which describes groups of commutative variables of a Boolean function is called a symmetry tree of the Boolean function.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an illustration of an exemplary embodiment of the present invention in which a tree D is shown;

FIG. 2 is an illustration of an exemplary embodiment of the present invention in which a tree D having variables is shown;

FIG. 3 is an illustration of an exemplary embodiment of the present invention wherein a symmetry tree for the function and is shown;

FIG. 4 is an illustration of an exemplary embodiment of the present invention wherein a symmetry tree for the function mux41 is shown;

FIG. 5 is an illustration of an exemplary embodiment of the present invention wherein a symmetry tree for a function $x_1x_2 \rightarrow x_3 \vee x_4 = \bar{x}_1 \vee \bar{x}_2 \vee x_3 \vee x_4$ is shown;

FIG. 6 is an illustration showing trees which are congruent;

FIG. 7 is an illustration showing trees which are symmetric for the function mux41;

FIG. 8 is an illustration showing a marked tree D obtained with help of S-union operation;

FIG. 9 is an illustration showing a marked tree D obtained with help of N-union operation;

FIG. 10 is an illustration showing a marked tree D obtained with help of $SN_m$ operation;

FIGS. 11 & 12 are illustrations of exemplary input trees;

FIG. 13 is an illustration of the result of a procedure for the input tree of FIG. 12;

FIG. 14 is a flow chart depicting an exemplary method of the present invention wherein a procedure to construct a 1-symmetric part of a symmetry tree is shown;

FIG. 15 is a flow chart depicting an exemplary method of the present invention wherein a procedure to construct an m-symmetric part of a symmetry tree is shown; and FIG. 16 is a flow chart depicting an exemplary method of the present invention wherein a procedure to construct a symmetry tree of a Boolean function is shown.

DETAILED DESCRIPTION OF THE INVENTION

Reference will now be made in detail to the presently preferred embodiments of the invention, examples of which are illustrated in the accompanying drawings.

Referring generally now to FIGS. 1 through 16, exemplary embodiments of the present invention are shown. Many Boolean functions have commutative variables. Variables of a Boolean function are commutative if after any permutation of these variables, the value of the function is not changed. For example, all variables of the disjunction function and$3(x_1,x_2,x_3)=x_1x_2x_3$ are commutative variables. Contrariwise the implication function $x_1 \rightarrow x_2 = \bar{x}_1 \vee x_2$ has no commutative variables. The multiplexer function mux41($x_1$, $x_2,x_3,x_4,x_5,x_6)=x_1\bar{x}_5\bar{x}_6 \vee x_2\bar{x}_5x_6 \vee x_3x_5\bar{x}_6 \vee x_4x_5x_6$ does not have commutative variables but if both permutations $x_2$ with $x_3$ and $x_5$ with $x_6$ are made, then the function is not changed, i.e. the groups of the variables $\{x_2, x_5\}$ and $\{x_3, x_6\}$ are commutative. Such functionality may be utilized through use of the present invention to provide an optimized integrated circuit.

Integrated circuit (IC) chips include a plurality of cells. Each cell may include one or more circuit elements, such as transistors, capacitors and other basic circuit elements as contemplated by a person of ordinary skill in the art, interconnected in a standardized manner to perform a specific function. Cells that include two or more interconnected gates or elements are also available as standard modules in a circuit library. If cell C from the circuit library realizes a Boolean function $f(x_1, x_2, \ldots, x_n)$ then the cell C has n input pins (each pin corresponds to one variable) and one output pin. If some signals are set to the input pins, then an output signal appears on the output pin. Each input pin of the cell has a corresponding capacity and delay from the pin to the output pin. The capacities and delays of the input pins may be different even if the variables corresponding to these pins are commutative. Therefore if signals inputted to commutative pins are permuted, the output function is not changed but the delays of paths going through these pins may be changed. This property of cells may be used to minimize the path delays and eliminate the ramptime violations in internal synthesis tools, such as the synthesis tool described in U.S. patent application Ser. No. 09/677,475 to A. Zolotykh, titled "Method and Apparatus for Timing Driven Resynthesis", filed Oct. 2, 2000, Application Number EL 701 326 382 US, which is herein incorporated by reference in its entirety. A data structure which describes groups of commutative variables of a Boolean function is called a symmetry tree of the Boolean function. An example of symmetry trees may be found in U.S. patent application Ser. No. 09/677,940, titled "Method and Apparatus for Quick Search for Identities Applicable to Specified Formula," filed Oct. 2, 2000, Attorney Docket Number LSI 99-346, which is also incorporated by reference in its entirety.

The present invention provides the ability to construct a symmetry tree for any Boolean function automatically. For example, let $X=\{x_1, \ldots, x_n\}$ be a set of variables and $f(x_1, \ldots, x_n)$ be a Boolean function. If i, j$\in\{1,2, \ldots, n\}$, i≠j then denote the following:

$$P^i_j(f(x_1, \ldots, x_{i-1},x_i,x_{i+1}, \ldots ,x_{j-1},x_j,x_{j+1}, \ldots, X_n))=$$
$$f(x_1, \ldots ,x_{i-1},x_j,x_{i+1}, \ldots x_{j-1},x_i,x_{j+1}, \ldots ,x_n).$$

It is clear that $P^i_j(f)=P^j_i(f)$.

Let $X_1=\{X_{i_1}, \ldots, X_{i_m}\}\subseteq X$, $X_2=\{X_{j_1}, \ldots, X_{j_m}\}\subseteq X$ be ordered sets of variables such that $i_p \neq i_q$ and $j_p \neq j_q$ if p≠q. $X_1$ and $X_2$ are symmetric relatively the function $f$ if $X_1 \cap X_2 = \emptyset$ and $P^{i_1}_{j_1}(P^{i_2}_{j_2}( \ldots P^{i_m}_{j_m}(f(x_1, \ldots, x_n)) \ldots ))=f(x_1, \ldots, x_n)$. A set of ordered sets of variables $\{X_1, \ldots, X_k\}(X_1, \ldots, X_k \subseteq X, k \geq 2)$ is maximal symmetric relatively the function $f$ if $\{X_1, \ldots, X_k\}$ is symmetric relatively the function $f$ and for each $X' \subseteq X$, $\{X_1, \ldots, X_k, X'\}$ is not symmetric relatively the function $f$.

For instance, some examples of symmetric sets of ordered sets of variables may include the following. Let mux41($x_1$, $x_2, x_3, x_4, x_5, x_6)=x_1\bar{x}_5\bar{x}_6 \vee x_2\bar{x}_5x_6 \vee x_3x_5\bar{x}_6 \vee x_4x_5x_6$ and and3 $(x_1, x_2, x_3)=x_1x_2x_3$. The set $\{\{x_1\}, \{x_2\}\}$ is symmetric relatively the function and3 but it is not maximal symmetric. The set $\{\{x_2, \{x_2\}, \{x_3\}\}$ is maximal symmetric relatively the function and3. The set $\{\{x_2, x_5\}, (x_3, x_6)\}$ is maximal symmetric relatively the function mux41.

A set of variables $X' \subseteq X$ is S-set of a function $f$ if there are sets $X_1, \ldots, X_k \subseteq X$, $k \geq 2$ such that $X_1 \cup \ldots \cup X_k = X'$ and $\{X_1, \ldots, X_k\}$ is symmetric relatively the function $f$. For example, $\{x_1, x_2\}$ and $\{x_1, x_2, x_3\}$ are S-sets of and3, $\{x_2, x_3, x_5, x_6\}$ is S-set of mux41, $\{x_1, x_2, x_3, x_4, x_5, x_6\}$ is not S-set of mux41.

If $X' \subseteq X$ is S-set of a function $f$, $X_1 \cup \ldots \cup X_k = X'$, and $\{X_1 \ldots, X_k\}$ is symmetric relatively the function $f$ then $\{X_1, \ldots, X_k\}$ is called S-partition of X'. $\{X_1, \ldots, X_k\}$ is called maximal S-partition of X' if $\{X_1, \ldots, X_k\}$ is S-partition of X' and k is maximal cardinality of S-partitions of X'. Cardinality of a set A is the number of elements of the set A.

A tree is a graph without loops and with one pole which is called a root. FIG. 1 shows an example of a tree D, where the node α is the root of the tree D, the nodes β, γ, δ are sons of the node α, the nodes ε, ζ are sons of the node δ, the nodes η, θ, are sons of the node ε, the nodes ϑ, ι are sons of the node ζ, the nodes β, γ, η, θ, ϑ, ι are leaves of the tree D, the nodes α, δ, ε, ζ are internal nodes of the tree D.

Let D be a tree with n leaves. To each leaf of the tree D, a variable from $X=\{x_1, \ldots, x_n\}$ is assigned. If β is a node of the tree D, then $A_\beta$ is the ordered set of variables which is assigned to leaves of the branch with root β, the order of variables is determined by the depth-first tree pass algorithm. For example, for a tree D shown on FIG. 2, $A_\alpha=\{x_1, x_4, x_2, x_5, x_3, x_6\}$, $A_\delta$, $=\{x_2, x_5, x_3, x_6\}$, $A_\iota=\{x_2, x_5\}$, and $A_\beta=\{x_1\}$.

Let $f(x_1, \ldots, x_n)$ be a Boolean function. A tree D is a symmetry tree for the function $f(x_1, \ldots, x_n)$ if the following conditions hold:

(i) the tree D has n leaves and each leaf of the tree D is marked by some variable from $X=\{x_1, \ldots, x_n\}$;

(ii) each internal node of the tree D is marked by symbol N or S;

(iii) if a node β of the tree D is marked by symbol S and $\beta_1, \ldots, \beta_m$ are sons of the node β then $\{A_{\beta_m}\}$ is maximal symmetric relatively $f$ and $\{A_\beta, \ldots, A_{\beta_m}\}$ is maximal S-partition of the set $A_\beta$;

(iv) if a node β of the tree D is marked by symbol N and $\beta_1, \ldots, \beta_m$ are sons of the node β then the set $A_\beta$ is not S-set of the function $f$ and for each $i \in \{1, \ldots, m\}$, $\beta_1$ is not marked by symbol N.

For example, the tree shown in FIG. 3 is the symmetry tree for the function and3. The shown in FIG. 4 is the symmetry tree for the function mux41. The tree shown in FIG. 5 is the symmetry tree for the function $x_1x_2 \rightarrow x_3 \lor x_4 = \bar{x}_1 \lor \bar{x}_2 \lor x_3 \lor x_4$. It should be noted that some Boolean functions may have several symmetry trees.

A tree is a marked tree if the leaves of the tree are marked by variables and the internal nodes of the tree are marked by symbols N or S. Two marked trees are congruent if the difference between the marked trees is only in marks of leaves. For example, the trees shown in FIG. 6 are congruent.

If D is a tree, the root of the tree D is denoted by R(D). The two marked trees $D_1$ and $D_2$ are symmetric for a Boolean function $f(x_1, \ldots x_n)$ if $D_1$ and $D_2$ are congruent, $A_{R(D_1)}$, $A_{R(D_2)}$ $\subseteq \{x_1, \ldots, x_n\}$, $A_{R(D_1)}$ and $A_{R(D_2)}$ are symmetric relatively the function $f$. For example, the trees shown in FIG. 7 are symmetric for the function mux41.

Marked trees $D_1, D_2, \ldots, D_q$ are 1-symmetric for a Boolean function $f(x_1, \ldots, x_n)$ if for each i, $j \in \{1, \ldots, q\}$, $i \neq j$, $D_i$ and $D_j$ are symmetric for $f$. If marked trees $D_1, D_2, \ldots, D_q$ are 1-symmetric for a function $f$, then the marked tree D shown in FIG. 8 is obtained with help of S-union operation and is denoted as $D=S(D_1, \ldots, D_q)$.

If $D_1, D_2, \ldots, D_q$ are marked trees, then the marked tree D shown in FIG. 9 is obtained with help of N-union operation and is denoted as $D=N(D_1, \ldots, D_m)$.

A set of marked trees $\{\{D_1^1, D_2^1, \ldots, D_m^1\}, \ldots, \{D_1^k, D_2^k, \ldots, D_m^k\}\}$ is m-symmetric for a function $f$ if for each i, $j \in \{1, \ldots, k\}$, $i \neq j$, $N(D_1^i, D_2^i, \ldots, D_m^i)$ and $N(D_1^j, D_2^j, \ldots, D_m^j)$ are symmetric for $f$.

If a set of marked trees $\{\{D_1^1, D_2^1, \ldots, D_m^1\}, \ldots, \{D_1^k, D_2^k, \ldots, D_m^k\}\}$ is m-symmetric for a function $f$, then the marked tree D shown on FIG. 10 is obtained with help of $SN_m$ operation and is denoted as $D=SN_m(\{D_1^1, D_2^1, \ldots, D_m^1\}, \ldots, \{D_1^k, D_2^k, \ldots, D_m^k\})$ Procedure to Construct 1-Symmetric Part of Symmetry Tree The input of this procedure is a Boolean function $f(x_1, \ldots, x_n)$ and a set of marked trees. The output of this procedure is the set of marked trees each of which is obtained from input trees utilizing a finite number of S-union operations, and S-union operation may not be applied for any subset of output trees.

For example, for the function and3 $(x_1, x_2, x_3)$ and input trees shown in FIG. 11, the result of this procedure is the tree shown in FIG. 3 (i.e. if a symmetry tree of a function includes only nodes marked by symbol S then this procedure constructs the symmetry tree of the function if input of the procedure is the set of nodes marked by variables). For the function $x_1x_2 \rightarrow x_3 \lor x_4$ and input trees shown in FIG. 12, the result of this procedure is the set of trees shown on FIG. 13.

Referring now to FIG. 14, an exemplary method of the present invention is shown wherein a procedure constructs a 1-symmetric part of the symmetry tree. At step 100, the input of the procedure is received, an initial set of trees $T=\{D_1, \ldots D_k\}$ and function $f$. At step 102 i is set equal to one. If at step 104, i is equal to k, then at step 106, the procedure returns set T as the result.

If, at step 104, i is less than k, then at step 108, j is set equal to i+1 and an auxiliary set of trees $L=\{D_i\}$ is initialized.

If at step 110, the trees $D_t$ and $D_j$ are not symmetric for function $f$ then the process proceeds to step 112. If at step 112, j is less than k, then at step 114, j is set equal to j+1 and the process loops back to step 110. If at step 112a, j is equal to k, then the process proceeds to step 120.

If at step 110, the trees $D_i$ and $D_j$ are symmetric for function $f$ then at step 116, the tree $D_j$ is removed from the set T and added to the set L. When $D_j$ is removed from the set T, then the trees of the set T are renumbered, i.e. set $D_q=D_{q+1}$ for each q=j, $\ldots$, k−1, and set k=k−1.

If at step 118, j is less than or equal to k, then the process loops back to step 110, otherwise the process proceeds to step 120.

If at step 120, |L|=1 then the process proceeds to step 122. Here |L| is the cardinality of the set L, i.e. the number of elements of the set L. If |L|=1 it means that there are no trees which are symmetric for tree $D_1$. At step 122, i is set equal to i+1 and the process loops back to step 104.

If at step 120 |L|>1, then the trees from L are symmetric for function $f$. Let $L=\{D_i, D_{j_1}, \ldots, D_{j_q}\}$. A new tree $D'=S(D_i, D_{j_1}, \ldots, D_{j_q})$ is constructed utilizing a S-union operation. The tree $D_i$ is removed from the set T and the trees of the set T are renumbered, i.e. $D_p$ is set equal to $D_{p+1}$ for each p=i, $\ldots$, k−1. The new tree D' is added to the end of the set T, i.e. $D_k$ is set equal to D'. Then the process loops back to step 104.

Procedure to Construct m-symmetric Part of Symmetry Tree

For purposes of the following discussion, suppose that m is greater than or equal to two. The input of this procedure is a Boolean function $f(x_1, \ldots, x_n)$ and a set of marked trees. The output of this procedure is the set of marked trees each of which is obtained from input trees by utilizing one $SN_m$ operation.

FIG. 15 is a flow chart depicting an exemplary method of the present invention in which the basic steps of the procedure to construct a m-symmetric part of the symmetry tree are shown. Step 200 is the input of the procedure, such as an initial set of trees T and function $f$. At step 202, R is set equal to Ø. R is an auxiliary set of marked trees. R may include new trees obtained utilizing an $SN_m$ operation.

If at step 204, |T|<2m then at step 206, the procedure returns the set T∪R as the result of the procedure. If at step 204, |T| is greater than or equal to 2m, then at step 208, a first subset G of the set T is obtained such that |G|=m. For purposes of the present example, consider that all subsets of the set T={$D_1, \ldots, D_k$} with cardinality m are enumerated. For example, the first subset is {$D_1, \ldots, D_m$}, the second subset is {$D_1, \ldots D_{m-1}, D_{m+1}$}, etc. and {$D_{k-m+1}, \ldots, D_k$} is the last subset of the set T.

At step 210, a new tree D'=N(G) is constructed. For example, if G={$D_1, \ldots, D_m$}, the D' is the tree shown in FIG. 9. L is set equal to {D'} and A is set equal to T\G, where L and A are an auxiliary sets of marked trees. The set T\G contains all elements of the set T which do not belong to the set G.

At step 212, the first subset Q is obtained of the set A such that |Q|=m.

At step 214, a first permutation of the set Q is obtained. If Q is equal to {$D_{i_1}, \ldots, D_{i_m}$} then there are m! permutations of elements of Q. For example, consider that {$D_{i_1}, \ldots, D_{i_m}$} is a first permutation of Q, {$D_{i_1}, \ldots, D_{i_{m-2}}, D_{i_m}, D_{i_{m-1}}$} is a second permutation of Q, and the like, and {$D_{i_m}, D_{i_{m-1}}, \ldots, D_{i_1}$} is last permutation of Q.

At step 216 a new tree D"=N(Q) is constructed.

If at step 218 the trees D' and D" are not symmetric for function $f$ then the process proceeds to step 220.

If at step 220, Q is not the last permutation then at step 222 a next permutation of Q is obtained and the process loops back to step 216. If at step 220 Q is the last permutation, then the process proceeds to step 224.

If at step 224, Q is not the last subset of the set A with cardinality m, then at step 226 a next subset Q is obtained such that |Q|=m and the process loops back to step 214. If at step 224, Q is the last subset of the set A then the process proceeds to step 228. If at step 228 |L| is greater than 1, then the process proceeds to step 240, otherwise the process proceeds to step 230.

If at step 230, G is not the last subset of the set T, then at step 232 a next subset G is obtained such that |G|=m and the process loops back to step 210. If at step 230, G is the last subset of the set T, at step 234 the procedure returns the set T∪R as the result of the procedure.

If at step 218 the trees D' and D" are symmetric for function $f$, then at step 236 L is set equal to L∪{D"}, i.e. the tree D" is added to the set L. T is set equal to T\(Q∪G) and A is set equal to A\Q.

If at step 238 |A|≧m then the process loops back to step 212. If at step 238 |A|<m then the process proceeds to step 240.

At step 240, a new tree D'=S(L) is constructed. For example, if L={$D_1, \ldots, D_q$} the D' is the tree shown in FIG. 8. R is set equal to R∪{D'}, i.e. the tree D' is added to the set R. Then the process loops back to step 204.

Procedure to Construct Symmetry Tree of Boolean Function

The input of the procedure is a Boolean function $f(x_1, \ldots, x_n)$. The output of the procedure is a symmetry tree of the function $f$.

Referring now to FIG. 16, an exemplary method of the present invention is shown wherein a flow chart that shows the basic steps of a procedure to construct a symmetry tree of the Boolean function $f$. At step 300, the initial set of the trees T={$D_1, \ldots, D_n$} is set, where $D_i$ is the tree which includes only one node marked by variable $x_i$(i=1, \ldots, n).

At step 302 the procedure to construct a 1-symmetric part as described previously is performed to the set T and the function $f$ let T'={$D'_1, \ldots, D'_k$} be the result of the procedure.

If at step 304, |T'|=1 then at step 306 the procedure returns the tree $D'_1$. If at step 304 |T'|>1, then at step 308, m is set equal to 2.

If at step 310 m>|T'|/2, then at step 312, the tree N(T) is constructed utilizing the N-union operation and this tree is returned as the result of the procedure. If at step 310 m≦|T'|/2, then at step 314, the procedure to construct m-symmetric part as described previously is applied to the set T' and the function $f$. Let T" be the result of this procedure.

If at step 316 T'=T" then at step 318, m is set equal to m+1 and the process loops back to step 310. If at step 316 T'≠T" then at step 320 T is set equal to T" and the process loops back to step 302.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not necessarily meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method to construct a symmetry tree of a Boolean function, comprising:

(a) setting an initial set of the trees $T=\{D_1, \ldots, D_n\}$ and function $f$, wherein $D_i$ is a tree which includes a node marked by variable $x_1(i=1, \ldots, n)$, and proceeding to step (b);

(b) applying a procedure to construct a 1-symmetric part for the set T and the function $f$, wherein $T'=\{D'_1, \ldots, D'_k\}$ is the result of the applied procedure, and proceeding to step (c);

(c) determining whether $|T'|=1$, wherein $|T'|$ is the cardinality of the set T', and if $|T'|=1$, then the tree $D'_1$ is returned, otherwise, proceeding to step (d);

(d) determining whether $|T'|>1$, if $|T'|>1$, then m is set equal to 2, where m corresponds to m-symmetric part of the set T', and proceeding to step (e);

(e) determining whether $m>|T'|/2$, and if so, constructing tree N(T') utilizing an N-union operation and returning the tree as the result of the operation, otherwise proceeding to step (f);

(f) determining whether $m \leq |T'|/2$, and if so, applying a procedure to construct an m-symmetric part to the set T' and the function $f$, wherein T'' is the result of the procedure, and proceeding to step (g); and (g) determining whether T'=T'', and if so, m is set equal to m+1 and the method returns to step (f), if T'≠T'', then T is set equal to T'' and the method returns to step (b).

wherein the method is utilized to minimize path delays and eliminate ramptime violations in internal synthesis tools for intergrated circuits.

2. The method as described in claim 1, wherein the procedure to construct a 1-symmetric part to the set T and the function $f$ of step (b), in which the input of the procedure is a Boolean function $f(x_1, \ldots, x_n)$ and a set of marked trees and the output of the procedure is a set of marked trees, is as follows:

(b)(1) receiving an input including an initial set of trees $T=\{D_i, \ldots D_k\}$ and function $f$, and continuing to step (b)(2);

(b)(2) setting i equal to one, and continuing to step (b)(3);

(b)(3) determining if i is less than k, if i is less than k, setting j equal to i+1, initializing an auxiliary set of trees $L=\{D_i\}$ and continuing to step (b)(4), otherwise returning set T as a result of the procedure;

(b)(4) determining if trees $D_i$ and $D_j$ are symmetric for function $f$, and if so proceeding to step (b)(7), and if not, proceeding to step (b)(5);

(b)(5) determining if j is less than k, and if so, setting j equal to j+1 and proceeding to step (b)(4), otherwise proceeding to step (b)(6);

(b)(6) determining if j is equal to k, and if so, proceeding to step (b)(9);

(b)(7) removing the tree $D_j$ from the set T and adding the tree $D_j$ to the set L, when $D_j$ is removed from the set T, the trees of the set T are renumbered, k is set equal to k−1, and proceeding to step (b)(8);

(b)(8) determining if j is less than or equal to k, if so, proceeding to step (b)(4), otherwise proceeding to step (b)(9);

(b)(9) determining if $|L|=1$, wherein $|L|$ is the cardinality of the set L, and if so, proceeding to step (b)(10), otherwise proceeding to step (b)(11);

(b)(10) setting i equal to i+1 and proceeding to step (b)(3); and (b)(11) determining if $|L|>1$, and if so, then the trees from L are symmetric for function $f$, let $L=\{D_i, D_{j_1}, \ldots, D_{j_q}\}$, and a new tree $D'=S(D_i, D_{j_1}, \ldots, D_{j_q})$ is constructed utilizing a S-union operation, the tree $D_i$ is removed from the set T and the trees of the set T are renumbered, the new tree D' is added to the set T, then the process proceeds to step (b) (3).

3. The method as described in claim 1, wherein applying a procedure to construct an m-symmetric part to the set T' and the function $f$, wherein T'' is the result of the procedure is performed as follows:

(f)(1) R is set equal to Ø, wherein R is an auxiliary set of marked trees and may include new trees obtained utilizing an $SN_m$ operation, and continuing to step (f)(2);

(f)(2) determining if $|T|<2m$, and if so, the procedure returns the set T∪R as a result, otherwise T is greater than or equal to 2m and proceeding to step (f)(3);

(f)(3) obtaining a first subset G of the set T such that $|G|=m$, and continuing to step (f)(4);

(f)(4) constructing a new tree D'=N(G), setting L equal to {D'} and setting A equal to T\G, where L and A are an auxiliary sets of marked trees, the set T\G contains all elements of the set T which do not belong to the set G, and proceeding to step (f)(5);

(f)(5) obtaining a first subset Q that $|Q|=m$, and continuing to step (f) (6);

(f)(6) obtaining a first permutation of the set Q, and proceeding to step (f)(7);

(f)(7) constructing a new tree D''=N(Q) and proceeding to step (f)(8);

(f)(8) determining whether trees D' and D '' are symmetric for function $f$, if not, the procedure proceeds to step (f)(9), if so, the procedure proceeds to step (f)(13);

(f)(9) determining if the subset is the last permutation of Q, if Q is not the last permutation, a next permutation of Q is obtained and the procedure proceeds to step (f)(7), otherwise proceeding to step (f)(10);

(f)(10) determining if Q is the last subset of A, if Q is not the last subset of set A with cardinality m, then a next subset Q is obtained such that $|Q|=m$ and the process proceeds to step (f)(7), if Q is the last subset of the set A then the procedure proceeds to step (f)(11);

(f)(11) determining if $|L|$ is greater than 1, if so, proceeding to step (f)(12), otherwise proceeding to step (f)(15);

(f)(12) determining if G is the last subset of T, if G is not the last subset of the set T, a next subset G is obtained such that $|G|=m$ and the procedure proceeds to step (f)(4), if G is the last subset of the set T, the procedure returns the set T∪R as the result of the procedure;

(f)(13) setting L equal to L∪{D''}, such that the tree D'' is added to the set L, T is set equal to T\(Q∪G) and A is set equal to A\Q, and proceeding to step (f)(14);

(f)(14) determining if $|A| \geq m$, and if $|A| \geq m$, then proceeding to step (f)(6), otherwise if $|A|<m$, then the procedure proceeds to step (f)(15); and (f)(15) constructing a new tree D'=S(L), set R equal to R∪{D'}, so that the tree D' is added to the set R, and proceed to step (f)(2).

4. The method as described in claim 1, wherein a data structure which describes groups of commutative variables of a Boolean function is a symmetry tree of the Boolean function.

5. The method as described in claim 1, wherein $f(x_1, \ldots, x_n)$ is a Boolean function, a tree D is a symmetry tree for the function $f(x_1, \ldots, x_n)$ if the following conditions hold: (1) the tree D has n leaves and each leaf of the tree D is marked by some variable from $X=\{x_1, \ldots, x_n\}$; (2) each internal node of the tree D is marked by symbol N or S; (3) if a node of the tree D is marked by symbol S and $\beta_1, \ldots, \beta_m$ are sons of the node $\beta$ then $\{A_{\beta 1}, \ldots, A_{\beta_m}\}$ is maximal symmetric relatively $f$ and $\{A_{\beta_1}, \ldots, A_{\beta_m}\}$ is maximal S-partition of the set $A_\beta$; and (4) if a node $\beta$ of the tree D is marked by symbol N and $\beta_1, \ldots, \beta_m$ are sons of the node $\beta$ then the set $A_\beta$ is not S-set of the function $f$ and for each $i \in \{1, \ldots, m\}$, $_i\beta_i$ is not marked by symbol N.

6. A system for constructing a symmetry tree of a Boolean function, comprising:
   a memory suitable for storing a program of instructions; and
   a processor suitable for performing the program of instructions, wherein the program of instructions configures the processor to perform a method comprising steps of
   (a) setting an initial set of the trees $T=\{D_1, \ldots, D_n\}$ and function $f$, wherein $D_i$ is a tree which includes a node marked by variable $x_i (i=1, \ldots, n)$, and proceeding to step (b);
   (b) applying a procedure to construct a 1-symmetric part for the set T and the function $f$, wherein $T'=\{D'_1, \ldots, D'_k\}$ is the result of the applied procedure, and proceeding to step (c);
   (c) determining whether $|T'|=1$, if $|T'|=1$, then the tree $D'_1$ is returned, otherwise, proceeding to step (d);
   (d) determining whether $|T'|>1$, if $|T'|>1$, then m is set equal to 2, where m corresponds to m-symmetric part of the set T', and proceeding to step (e);
   (e) determining whether $m>|T'|/2$, and if so, constructing tree N(T') utilizing an N-union operation and returning the tree as the result of the operation, otherwise proceeding to step (f);
   (f) determining whether $m<|T'|/2$, and if so, applying a procedure to construct an m-symmetric part to the set T' and the function $f$, wherein T" is the result of the procedure, and proceeding to step (g); and
   (g) determining whether T'=T", and if so, m is set equal to m+1 and the method returns to step (f), if T'≠T", then T is set equal to T" and the method returns to step (b),
   wherein the method is utilized to minimize path delays and eliminate ramptime violations in internal synthesis tools for intergrated circuits.

7. The system as described in claim 6, wherein the procedure to construct a 1symmetric part to the set T and the function $f$ of step (b), in which the input of the procedure is a Boolean function $f(x_1, \ldots, x_n)$ and a set of marked trees and the output of the procedure is a set of marked trees, is as follows:
   (b)(1) receiving an input including an initial set of trees $T=\{D_1, \ldots D_k\}$ and function $f$, and continuing to step (b)(2);
   (b)(2) setting i equal to one, and continuing to step (b)(3);
   (b)(3) determining if i is less than k, if i is less than k, setting j equal to i+1, initializing an auxiliary set of trees $L=\{D_1\}$ and continuing to step (b)(4), otherwise returning set T as a result of the procedure;
   (b)(4) determining if trees $D_i$ and $D_j$ are symmetric for function $f$, and if so proceeding to step (b)(7), and if not, proceeding to step (b)(5);
   (b)(5) determining if j is less than k, and if so, setting j equal to j+1 and proceeding to step (b)(4), otherwise proceeding to step (b)(6);
   (b)(6) determining if j is equal to k, and if so, proceeding to step (b)(9);
   (b)(7) removing the tree $D_j$ from the set T and adding the tree $D_j$ to the set L, when $D_j$ is removed from the set T, the trees of the set T are renumbered, k is set equal to k−1, and proceeding to step (b)(8);
   (b)(8) determining if j is less than or equal to k, if so, proceeding to step (b)(4), otherwise proceeding to step (b)(9);
   (b)(9) determining if $|L|=1$, wherein $|L|$ is the cardinality of the set L, and if so, proceeding to step (b)(10), otherwise proceeding to step (b)(11);
   (b)(10) setting i equal to i+1 and proceeding to step (b)(3); and
   (b)(11) determining if $|L|>1$, and if so, then the trees from L are symmetric for function $f$, let $L=\{D_i, D_{j_p}, \ldots, D_{j_q}\}$, and a new tree $D'=S(D_i, D_{j_p}, \ldots, D_{j_q})$ is constructed utilizing a S-union operation, the tree $D_i$ is removed from the set T and the trees of the set T are renumbered, the new tree D' is added to the set T, then the process proceeds to step (b)(3).

8. The system as described in claim 6, wherein applying a procedure to construct an m-symmetric part to the set T' and the function $f$, wherein T" is the result of the procedure is performed as follows:
   (f)(1) R is set equal to $\emptyset$, wherein R is an auxiliary set of marked trees and may include new trees obtained utilizing an $SN_m$ operation, and continuing to step (f)(2);
   (f)(2) determining if $|T|<2m$, and if so, the procedure returns the set $T \cup R$ as a result, otherwise $|T|$ is greater than or equal to 2m and proceeding to step (f)(3);
   (f)(3) obtaining a first subset G of the set T such that $|G|=m$, and continuing to step (f)(4);
   (f)(4) constructing a new tree D'=N(G), setting L equal to {D'} and setting A equal to T\G, where L and A are an auxiliary sets of marked trees, the set T\G contains all elements of the set T which do not belong to the set G, and proceeding to step (f)(5);
   (f)(5) obtaining a first subset Q that $|Q|=m$, and continuing to step (f)(6);
   (f)(6) obtaining a first permutation of the set Q, and proceeding to step (f)(7);
   (f)(7) constructing a new tree D"=N(Q) and proceeding to step (f)(8);
   (f)(8) determining whether trees D' and D" are symmetric for function $f$, if not, the procedure proceeds to step (f)(9), if so, the procedure proceeds to step (f)(13);
   (f)(9) determining if the subset is the last permutation of Q, if Q is not the last permutation, a next permutation of Q is obtained and the procedure proceeds to step (f)(7), otherwise proceeding to step (f)(10);
   (f)(10) determining if Q is the last subset of A, if Q is not the last subset of set A with cardinality m, then a next subset Q is obtained such that $|Q|=m$ and the process proceeds to step (f)(7), if Q is the last subset of the set A then the procedure proceeds to step (f)(11);
   (f)(11) determining if $|L|$ is greater than 1, if so, proceeding to step (f)(12), otherwise proceeding to step (f)(15);
   (f)(12) determining if G is the last subset of T, if G is not the last subset of the set T, a next subset G is obtained such that $|G|=m$ and the procedure proceeds to step (f)(4), if G is the last subset of the set T, the procedure returns the set $T \cup R$ as the result of the procedure;

(f)(13) setting L equal to L∪{D"}, such that the tree D" is added to the set L, T is set equal to T\(Q∪G) and A is set equal to A\Q, and proceeding to step (f)(14);

(f)(14) determining if |A|≧m, and if |A|≧m, then proceeding to step (f)(6), otherwise if |A|<m, then the procedure proceeds to step (f)(15); and (f)(15) constructing a new tree D'=S(L), set R equal to R∪{D'}, so that the tree D' is added to the set R, and proceed to step (f)(2).

9. The system as described in claim 6, wherein a data structure which describes groups of commutative variables of a Boolean function is a symmetry tree of the Boolean function.

10. The system as described in claim 6, wherein $f(x_1, \ldots, x_n)$ is a Boolean function, a tree D is a symmetry tree for the function $f(x_1, \ldots, x_n)$ if the following conditions hold: (1) the tree D has n leaves and each leaf of the tree D is marked by some variable from $X=\{x_1, \ldots, x_n\}$; (2) each internal node of the tree D is marked by symbol N or S; (3) if a node $\beta$ of the tree D is marked by symbol S and $\beta_1, \ldots, \beta_m$ are sons of the node $\beta$ then $\{A_{\beta_1}, \ldots, A_{\beta_m}\}$ is maximal symmetric relatively $f$ and $\{A_{\beta_1}, \ldots, A_{\beta_m}\}$ is maximal S-partition of the set $A_\beta$; and (4) if a node $\beta$ of the tree D is marked by symbol N and $\beta_1, \ldots, \beta_m$ are sons of the node $\beta$ then the set $A_\beta$ is not S-set of the function $f$ and for each $i \in \{1, \ldots, m\}$, $\beta_i$ is not marked by symbol N.

11. A computer-readable medium storing computer-executable method steps for constructing a symmetry tree of a Boolean function, the method comprising:

(a) setting an initial set of the trees $T=\{D_1, \ldots, D_n\}$ and function $f$, wherein $D_i$ is a tree which includes a node marked by variable $x_i$ (i=1, ..., n), and proceeding to step (b);

(b) applying a procedure to construct a 1-symmetric part for the set T and the function $f$, wherein $T'=\{D'_1, \ldots, D'_k\}$ is the result of the applied procedure, and proceeding to step (c);

(c) determining whether |T'|=1, if |T'|=1, then the tree $D'_1$ is returned, otherwise, proceeding to step (d);

(d) determining whether |T'|>1, if |T'|>1, then m is set equal to 2, where m corresponds to m-symmetric part of the set T', and proceeding to step (e);

(e) determining whether m>|T'|/2, and if so, constructing tree N(T') utilizing an N-union operation and returning the tree as the result of the operation, otherwise proceeding to step (f);

(f) determining whether m≦|T'|/2, and if so, applying a procedure to construct an m-symmetric part to the set T' and the function $f$, wherein T'" is the result of the procedure, and proceeding to step (g); and (g) determining whether T'=T'", and if so, m is set equal to m+1 and the method returns to step (f), if T'≠T'", then T is set equal to T'" and the method returns to step (b), wherein the method is utilized to minimize path delays and eliminate ramptime violations in internal synthesis tools for intergrated circuits.

12. The computer-readable medium as described in claim 11, wherein the procedure to construct a 1-symmetric part to the set T and the function $f$ of step (b), in which the input of the procedure is a Boolean function $f(x_1, \ldots, x_n)$ and a set of marked trees and the output of the procedure is a set of marked trees, is as follows:

(b)(1) receiving an input including an initial set of trees $T=\{D_1, \ldots D_k\}$ and function $f$, and continuing to step (b)(2);

(b)(2) setting i equal to one, and continuing to step (b)(3);

(b)(3) determining if i is less than k, if i is less than k, setting j equal to i+1, initializing an auxiliary set of trees $L=\{D_i\}$ and continuing to step (b)(4), otherwise returning set T as a result of the procedure;

(b)(4) determining if trees $D_i$ and $D_j$ are symmetric for function $f$, and if so proceeding to step (b)(7), and if not, proceeding to step (b)(5);

(b)(5) determining if j is less than k, and if so, setting j equal to j+1 and proceeding to step (b)(4), otherwise proceeding to step (b)(6);

(b)(6) determining if j is equal to k, and if so, proceeding to step (b)(9);

(b)(7) removing the tree $D_j$ from the set T and adding the tree $D_j$ to the set L, when $D_j$ is removed from the set T, the trees of the set T are renumbered, k is set equal to k−1, and proceeding to step (b)(8);

(b)(8) determining if j is less than or equal to k, if so, proceeding to step (b)(4), otherwise proceeding to step (b)(9);

(b)(9) determining if |L|=1, wherein |L| is the cardinality of the set L, and if so, proceeding to step (b)(10), otherwise proceeding to step (b)(11);

(b)(10) setting i equal to i+1 and proceeding to step (b)(3); and (b)(11) determining if |L|>1, and if so, then the trees from L are symmetric for function $f$, let $L=\{D_i, D_{j_1}, \ldots, D_{j_q}\}$, and a new tree $D'=S(D_i, D_{j_1}, \ldots, D_{j_q})$ is constructed utilizing a S-union operation, the tree $D_i$ is removed from the set T and the trees of the set T are renumbered, the new tree D' is added to the set T, then the process proceeds to step (b)(3).

13. The computer-readable medium as described in claim 11, wherein applying a procedure to construct an m-symmetric part to the set T' and the function $f$, wherein T'" is the result of the procedure is performed as follows:

(f)(1) R is set equal to ∅, wherein R is an auxiliary set of marked trees and may include new trees obtained utilizing an $SN_m$ operation, and continuing to step (f)(2);

(f)(2) determining if |T|<2m, and if so, the procedure returns the set T∪R as a result, otherwise |T| is greater than or equal to 2m and proceeding to step (f)(3);

(f)(3) obtaining a first subset G of the set T such that |G|=m, and continuing to step (f)(4);

(f)(4) constructing a new tree D'=N(G), setting L equal to {D'} and setting A equal to T\G, where L and A are an auxiliary sets of marked trees, the set T\G contains all elements of the set T which do not belong to the set G, and proceeding to step (f)(5);

(f)(5) obtaining a first subset Q that |Q|=m, and continuing to step (f)(6);

(f)(6) obtaining a first permutation of the set Q, and proceeding to step (f)(7);

(f)(7) constructing a new tree D"=N(Q) and proceeding to step (f)(8);

(f)(8) determining whether trees D' and D" are symmetric for function $f$, if not, the procedure proceeds to step (f)(9), if so, the procedure proceeds to step (f)(13);

(f)(9) determining if the subset is the last permutation of Q, if Q is not the last permutation, a next permutation of Q is obtained and the procedure proceeds to step (f)(7), otherwise proceeding to step (f)(10);

(f)(10) determining if Q is the last subset of A, if Q is not the last subset of set A with cardinality m, then a next subset Q is obtained such that |Q|=m and the process proceeds to step (f)(7), if Q is the last subset of the set A then the procedure proceeds to step (f)(11);

(f)(11) determining if |L| is greater than 1, if so, proceeding to step (f)(12), otherwise proceeding to step (f)(15);

(f)(12) determining if G is the last subset of T, if G is not the last subset of the set T, a next subset G is obtained such that |G|=m and the procedure proceeds to step (f)(4), if G is the last subset of the set T, the procedure returns the set T∪R as the result of the procedure;

(f)(13) setting L equal to L∪{D"}, such that the tree D" is added to the set L, T is set equal to T\(Q∪G) and A is set equal to A\Q, and proceeding to step (f)(14);

(f)(14) determining if |A|≧m, and if |A|≧m, then proceeding to step (f)(6), otherwise if |A|<m, then the procedure proceeds to step (f)(15); and (f)(15) constructing a new tree D'=S(L), set R equal to R∪{D'}, so that the tree D' is added to the set R, and proceed to step (f)(2).

14. The computer-readable medium as described in claim 11, wherein a data structure which describes groups of commutative variables of a Boolean function is a symmetry tree of the Boolean function.

15. The computer-readable medium as described in claim 11, wherein $f(x_1, \ldots, x_n)$ is a Boolean function, a tree D is a symmetry tree for the function $f(x_1, \ldots, x_n)$ if the following conditions hold: (1) the tree D has n leaves and each leaf of the tree D is marked by some variable from $X=\{x_1, \ldots, x_n\}$; (2) each internal node of the tree D is marked by symbol N or S, (3) if a node β of the tree D is marked by symbol S and $\beta_1, \ldots, \beta_m$ are sons of the node β then $\{A_{\beta_1}, \ldots, A_{\beta_m}\}$ is maximal symmetric relatively $f$ and $\{A_{\beta_1}, \ldots, A_{\beta_m}\}$ is maximal S-partition of the set $A_\beta$; and (4) if a node β of the tree D is marked by symbol N and $\beta_1, \ldots, \beta_m$ are sons of the node β then the set $A_\beta$ is not S-set of the function $f$ and for each $i \in \{1, \ldots, m\}, _{n}\beta_i$ is not marked by symbol N.

* * * * *